(12) United States Patent
Lee et al.

(10) Patent No.: US 11,422,455 B2
(45) Date of Patent: Aug. 23, 2022

(54) EUV EXPOSURE APPARATUS, AND OVERLAY CORRECTION METHOD AND SEMICONDUCTOR DEVICE FABRICATING METHOD USING THE SAME

(71) Applicant: Samsung Electronics Co., Ltd., Suwon-si (KR)

(72) Inventors: Doogyu Lee, Ansan-si (KR); Seungyoon Lee, Seoul (KR); Jeongjin Lee, Hwaseong-si (KR); Chan Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/464,826

(22) Filed: Sep. 2, 2021

(65) Prior Publication Data

US 2021/0397079 A1 Dec. 23, 2021

Related U.S. Application Data

(63) Continuation of application No. 16/952,844, filed on Nov. 19, 2020, now Pat. No. 11,137,673.

(30) Foreign Application Priority Data

Apr. 24, 2020 (KR) ........................ 10-2020-0050351

(51) Int. Cl.
*G03F 1/24* (2012.01)
*H01L 21/027* (2006.01)
*G03F 7/20* (2006.01)

(52) U.S. Cl.
CPC ............ *G03F 1/24* (2013.01); *G03F 7/70033* (2013.01); *G03F 7/70633* (2013.01); *G03F 7/70725* (2013.01); *H01L 21/0274* (2013.01)

(58) Field of Classification Search
CPC .... G03F 1/24; G03F 7/70033; G03F 7/70633; G03F 7/70725
See application file for complete search history.

(56) References Cited

U.S. PATENT DOCUMENTS 9,158,212 B2   10/2015 Ishigo
9,436,080 B2 *  9/2016 Beyer ................. G03F 7/70466
(Continued)

FOREIGN PATENT DOCUMENTS

| KR | 10-2011-0052214 A | 5/2011 |
| KR | 10-2017-0013975 A | 2/2017 |
| KR | 10-2018-0125677 A | 11/2018 |

OTHER PUBLICATIONS

Non-Final Office Action dated Mar. 19, 2021 in U.S. Appl. No. 16/952,844.

(Continued)

*Primary Examiner* — Hung V Nguyen
(74) *Attorney, Agent, or Firm* — Harness, Dickey & Pierce, P.L.C,

(57) ABSTRACT

Provided are an extreme ultraviolet (EUV) exposure apparatus for improving an overlay error in a EUV exposure process, and an overlay correction method and a semiconductor device fabricating method using the exposure apparatus. The EUV exposure apparatus includes an EUV light source; a first optical system configured to emit EUV light from the EUV light source to an EUV mask; a second optical system configured to emit EUV light reflected from the EUV mask to a wafer; a mask stage; a wafer stage; and a control unit configured to control the mask stage and the wafer stage, wherein, based on a correlation between a first overlay parameter, which is one of parameters of overlay errors between layers on the wafer, and a second overlay parameter, which is another parameter, the first overlay parameter (Continued)

is corrected through correction of the second overlay parameter.

10 Claims, 19 Drawing Sheets

(56) References Cited

U.S. PATENT DOCUMENTS

| | | |
|---|---|---|
| 9,857,698 B2 | 1/2018 | De Jongh et al. |
| 9,983,489 B2 | 5/2018 | Berendsen et al. |
| 10,085,334 B2 | 9/2018 | Yabu |
| 10,102,938 B2 | 10/2018 | Yabu et al. |
| 10,146,141 B2 | 12/2018 | Hung et al. |
| 10,191,392 B2 | 1/2019 | Dams et al. |
| 10,372,045 B2 | 8/2019 | Akkermans et al. |
| 10,416,570 B2 | 9/2019 | Kugler et al. |
| 10,437,160 B2 | 10/2019 | Fischer et al. |
| 10,566,252 B2 | 2/2020 | Lee et al. |
| 10,811,265 B2 * | 10/2020 | deVilliers ............ G03F 7/70633 |
| 2019/0137893 A1 | 5/2019 | Den Boef et al. |
| 2019/0339211 A1 | 11/2019 | Huijgen et al. |
| 2020/0278614 A1 * | 9/2020 | Werkman ............ G03F 7/70525 |

OTHER PUBLICATIONS

Notice of Allowance dated Jun. 9, 2021 in U.S. Appl. No. 16/952,844.

\* cited by examiner

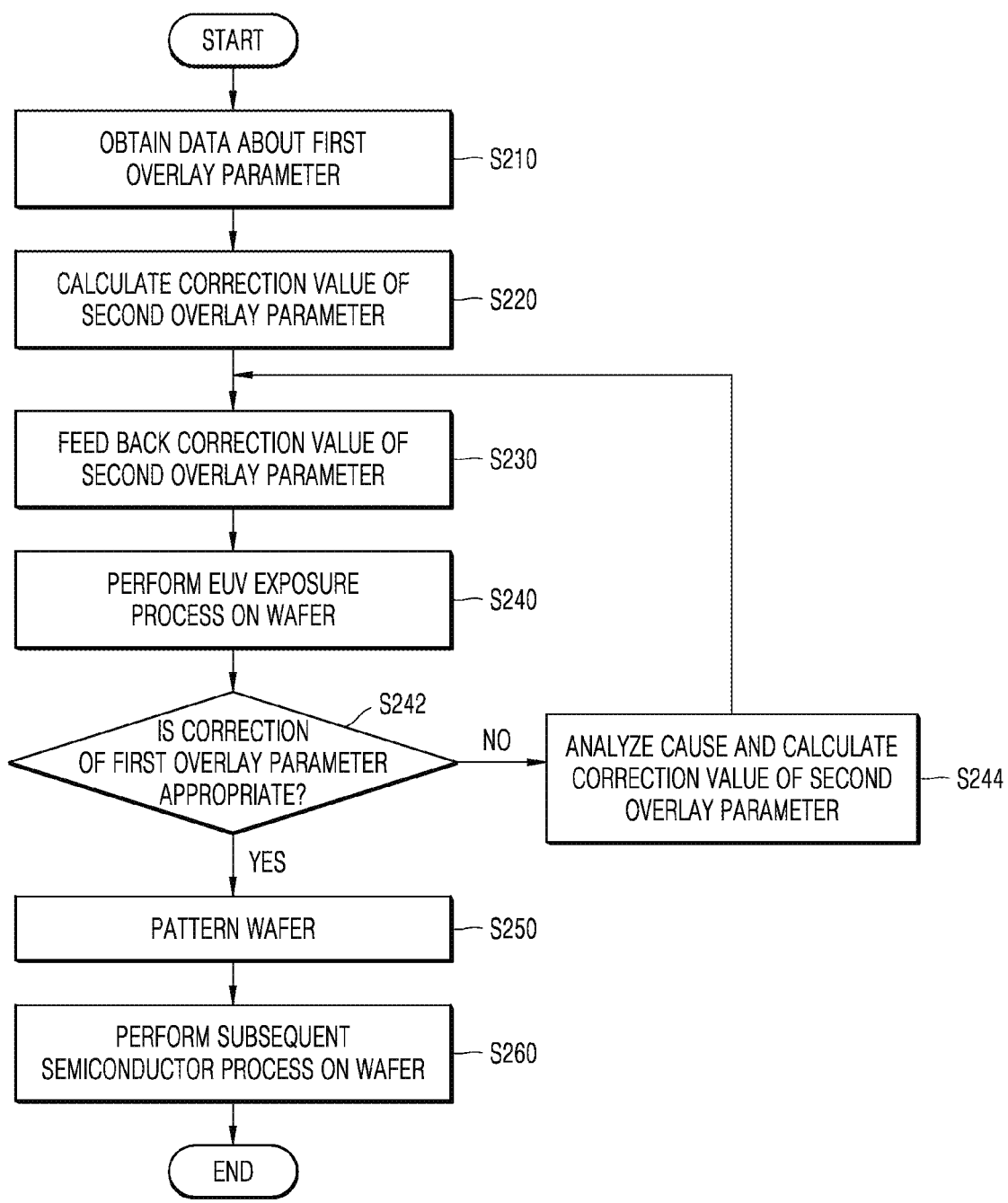

EUV EXPOSURE APPARATUS, AND OVERLAY CORRECTION METHOD AND SEMICONDUCTOR DEVICE FABRICATING METHOD USING THE SAME

CROSS-REFERENCE TO RELATED APPLICATIONS

This application is a Continuation of U.S. application Ser. No. 16/952,844, filed on Nov. 19, 2020, which is now U.S. Pat. No. 11,137,673 which claims the benefit of Korean Patent Application No. 10-2020-0050351, filed on Apr. 24, 2020, in the Korean Intellectual Property Office, the disclosures of each of which are incorporated herein in its entirety by reference.

BACKGROUND

The inventive concepts relate to an exposure apparatus and an overlay correction method, and more particularly, to an exposure apparatus using extreme ultraviolet (EUV) light and an overlay correction method using the exposure apparatus.

Recently, as line widths of semiconductor circuits are becoming finer, exposure light sources emitting shorter wavelengths, used during the patterning of the circuits, have been required. For example, EUV light has been used as an exposure light source. Due to absorption characteristics of EUV rays, a reflective EUV mask is generally used in a EUV exposure process. A plurality of mirrors may be included in an illumination optical system for transmitting EUV rays to a EUV mask and a projection optical system for projecting the EUV rays reflected from the EUV mask to an object to be exposed. As a level of difficulty of the exposure process is increasing, small errors occurring in the EUV mask and/or the mirrors may cause serious errors in formation of a pattern on a wafer.

SUMMARY

The inventive concepts provide an extreme ultraviolet (EUV) exposure apparatus for improving an overlay error in a EUV exposure process, and an overlay correction method and a semiconductor device fabricating method using the exposure apparatus.

According to an aspect of the inventive concepts, an EUV exposure apparatus includes an EUV light source configured to emit EUV light; a first optical system configured to transmit the EUV light from the EUV light source to an EUV mask; a mask stage configured to orient the EUV mask; a second optical system configured to transmit the EUV light reflected from the EUV mask to a wafer stage; and a control unit configured to control the mask stage and the wafer stage, and to, based on a correlation between a first overlay parameter and a second overlay parameter, correct the first overlay parameter by correcting the second overlay parameter, wherein, the first overlay parameter a parameter associated with overlay errors between layers on the wafer, and the second overlay parameter is another parameter associated with the overlay errors between the layers of the wafers.

According to another aspect of the inventive concepts, an EUV exposure apparatus includes an EUV light source; a mask stage configured to orient an EUV mask; and a control unit configured to control the mask stage, and to correct a first overlay parameter among overlay error parameters between layers on a wafer, by correcting a second overlay parameter, wherein the first overlay parameter is related to an error three-dimensionally increasing on both sides of an axis in a first direction perpendicular to a scan direction in an EUV exposure process and the second overlay parameter is related to an error two-dimensionally increasing in the scan direction as a distance from the axis increases in the first direction.

According to another aspect of the inventive concepts, there is provided an overlay correction method performed by an extreme ultraviolet (EUV) exposure apparatus includes obtaining data about a first overlay parameter among parameters of overlay errors between layers on a wafer on which an EUV exposure process is performed, the first overlay parameter being related to an error which three-dimensionally increases on both sides of an axis in a first direction perpendicular to a scan direction in the EUV exposure process; calculating a correction value of a second overlay parameter among the parameters of overlay errors, based on a correlation between the first overlay parameter and the second overlay parameter, the second overlay parameter being related to an error which two-dimensionally increases in the scan direction as a distance from the axis increases in the first direction; feeding back the correction value of the second overlay parameter within the EUV exposure apparatus; and correcting the first overlay parameter by correcting the second overlay parameter, based on the correction value of the second overlay parameter.

According to another aspect of the inventive concepts, a semiconductor device fabricating method using an extreme ultraviolet (EUV) exposure apparatus includes obtaining, by the EUV exposure apparatus, data about a first overlay parameter among parameters of overlay errors between layers on a first wafer on which an EUV exposure process is performed, the first overlay parameter being related to an error which three-dimensionally increases as a distance from a central point to both sides increases in a first direction perpendicular to a scan direction in the EUV exposure process; calculating, by the EUV exposure apparatus, a correction value of a second overlay parameter among the parameters of overlay errors, based on a correlation between the first overlay parameter and the second overlay parameter, wherein the second overlay parameter is related to an error which two-dimensionally increases in the scan direction as a distance to the central point increases in the first direction; feeding back the correction value of the second overlay parameter within the EUV exposure apparatus; and performing the EUV exposure process on a second wafer by the EUV exposure apparatus; patterning the second wafer; and performing a subsequent semiconductor process on the second wafer, wherein the performing of the EUV exposure process on the second wafer includes correcting the first overlay parameter by correcting the second overlay parameter, based on the correction value of the second overlay parameter.

BRIEF DESCRIPTION OF THE DRAWINGS

Example embodiments of the inventive concepts will be more clearly understood from the following detailed description taken in conjunction with the accompanying drawings in which:

FIGS. 9A and 9B are flowcharts schematically illustrating semiconductor device fabricating methods using a EUV exposure apparatus, according to some example embodiments of the inventive concepts.

DETAILED DESCRIPTION OF THE EMBODIMENTS

Figure 1:
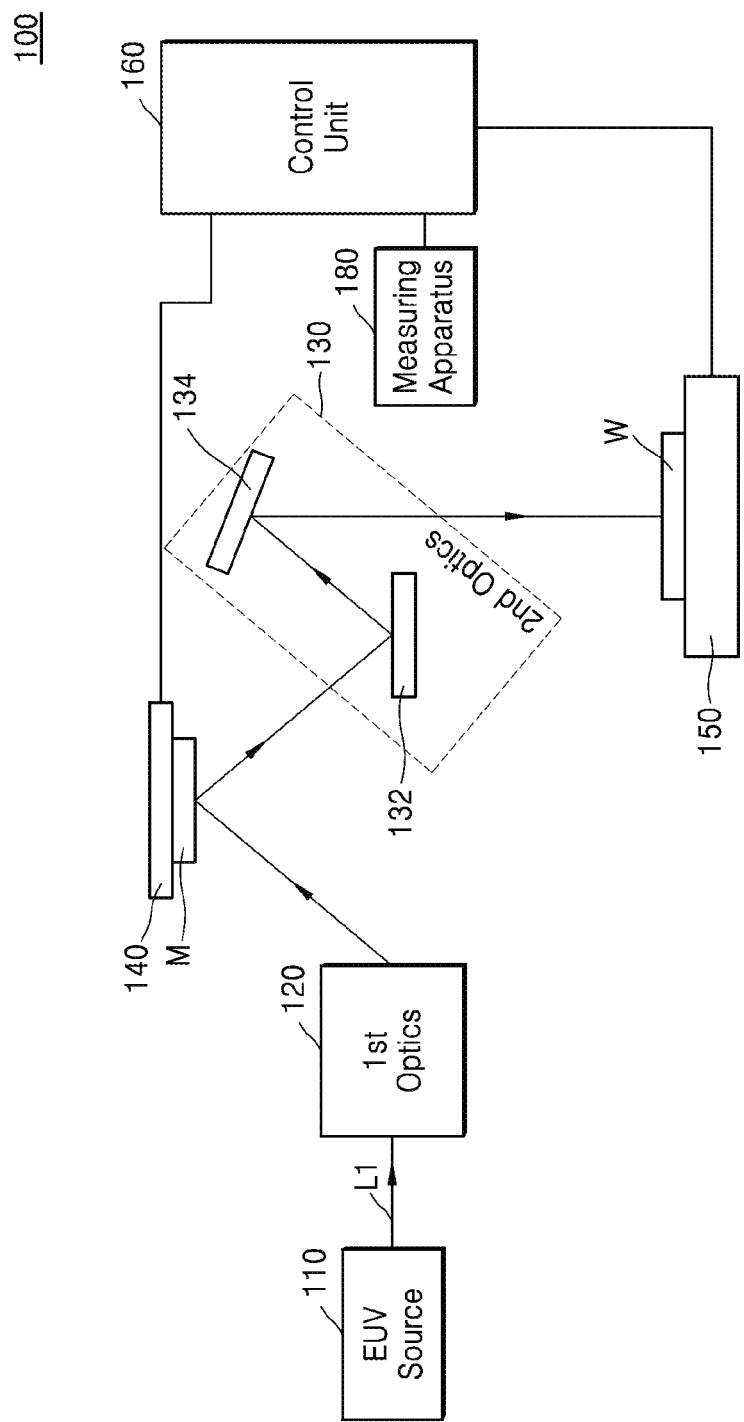
FIG. 1 is a conceptual diagram schematically illustrating an extreme ultraviolet (EUV) exposure apparatus according to an example embodiment of the inventive concepts.

Hereinafter, embodiments of the inventive concepts will be described in detail with reference to the accompanying drawings. The same elements are assigned the same reference numerals in the drawings and are not redundantly described herein.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 2:
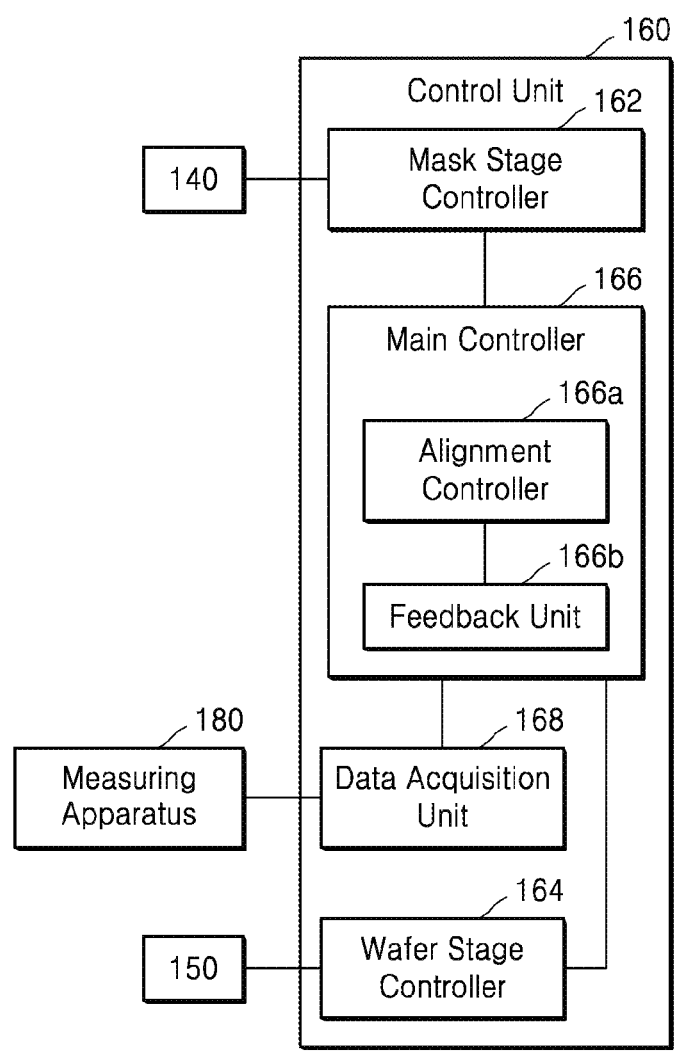
FIG. 2 is a detailed block diagram of a control unit included in the EUV exposure apparatus of FIG. 1.

FIG. 1 is a conceptual diagram schematically illustrating an extreme ultraviolet (EUV) exposure apparatus according to an example embodiment of the inventive concepts. FIG. 2 is a detailed block diagram of a control unit included in the EUV exposure apparatus of FIG. 1.

Referring to FIGS. 1 and 2, a EUV exposure apparatus 100 may include a EUV light source 110, a first optical system 120, a second optical system 130, a mask stage 140, a wafer stage 150, a control unit 160, and a measuring apparatus 180.

The EUV light source 110 may be configured to generate and output high-energy-density EUV light L1 within a wavelength range of about 5 nm to 50 nm. For example, the EUV light source 110 may generate and output the high-energy-density EUV light L1 having a wavelength of about 13.5 nm. The EUV light source 110 may be a plasma-based light source or a synchrotron radiation light source. Here, the plasma-based light source refers to a light source that generates plasma and uses light emitted by the plasma, and may include a laser-produced plasma (LPP) light source, a discharge-produced plasma (DPP) light source, and/or the like. However, the EUV light source 110 is not so limited.

The plasma-based light source may include a condensing mirror such as an elliptical mirror and/or a spherical mirror configured to concentrate the EUV light and, thus, to increase the energy density of illumination light incident on the first optical system 120.

The first optical system 120 may include a plurality of mirrors. For example, the first optical system 120 may include two or three mirrors. However, the number of mirrors of the first optical system 120 is not limited to two or three. The first optical system 120 may be configured to transmit the EUV light L1 from the EUV light source 110 to a EUV mask M. For example, the EUV light L1 from the EUV light source 110 may be reflected by the mirrors of the first optical system 120 to be incident on the EUV mask M placed on the mask stage 140. The first optical system 120 may transform the EUV light L1 into a curved slit form to be incident on the EUV mask M. Here, the curved slit form of the EUV light L1 may refer to a parabolic two-dimensional (2D) curve projected onto an x-y plane. The curved slit form and effects of the EUV light L1 will be described in more detail with reference to FIGS. 7A to 7D below.

The EUV mask M may be a reflective mask having a reflective region, a non-reflective region, and/or an intermediate reflective region. The EUV mask M may include a reflective multi-layer film on a substrate. The reflective multi-layer film may include a low thermal expansion coefficient material (LTEM) such as quartz, configured to reflect EUV light, and a pattern of an absorption layer on the reflective multi-layer film. The reflective multi-layer film may include a molybdenum (Mo) layer and a silicon (Si) layer alternately stacked. For example, the Mo and Si layers may be stacked in several tens or more layers. The absorption layer may be formed of, for example, TaN, TaNO, TaBO, Ni, Au, Ag, C, Te, Pt, Pd, Cr, or the like. However, the material of the reflective multi-layer film and the material of the absorption layer are not limited to the above materials. Here, the pattern of the absorption layer may correspond to the non-reflective region and/or the intermediate reflective region.

The EUV mask M may reflect the EUV light L1 incident thereon via the first optical system 120 to be incident on the second optical system 130. For example, the EUV mask M reflects the EUV light L1 from the first optical system 120 such that the EUV light L1 is structured according to a shape of the pattern including the reflective multi-layer film and the absorption layer on the substrate to be incident on the second optical system 130. The EUV light L1 may be structured to include at least a second or higher order diffraction light, based on the pattern on the EUV mask M. The structured EUV light L1 containing information about the shape of the pattern on the EUV mask M is incident on the second optical system 130 and projected to a EUV exposure object W through the second optical system 130 to form an image corresponding to the shape of the pattern. The EUV exposure object W may be a substrate, e.g., a wafer, which contains a semiconductor material such as silicon. Hereinafter, the EUV exposure object W and a wafer should be understood as the same concept unless otherwise specified.

The EUV mask M may be on the mask stage 140. The mask stage 140 may be configured to move on an x-y plane in an x-axis direction and/or a y-axis direction and to move in a z-axis direction perpendicular to the x-y plane. The mask stage 140 may be configured to rotate on the x-y plane about a z-axis and/or to rotate on a y-z plane and/or an x-z plane about one axis on the x-y plane (e.g., an x-axis or a y-axis). Due to the movement of the mask stage 140, the EUV mask M may be moved in the x-direction, the y-axis direction, and/or the z-axis direction, and/or rotated about the x-axis, the y-axis, and/or the z-axis.

The EUV exposure object W, for example, a wafer, may be on the wafer stage 150. The wafer stage 150 may be configured to secure a EUV exposure object W during the EUV exposure. The wafer stage 150 may be configured to move on an x-y plane in an x-axis direction and/or a y-axis direction and to move in a z-axis direction perpendicular to the x-y plane. The wafer stage 150 may be configured to rotate on the x-y plane about the z-axis and/or rotated on a y-z plane and/or an x-z plane about one axis on the x-y plane (e.g., an x-axis and/or a y-axis). Due to the movement of the wafer stage 150, the EUV exposure object W may move in the x-axis direction, the y-axis direction, and/or the z-axis direction, and/or rotate about the x-axis, the y-axis, and/or the z-axis.

The second optical system 130 may include a plurality of mirrors. Although for convenience of explanation, FIG. 1 illustrates that the second optical system 130 includes two mirrors (a first mirror 132 and a second mirror 134) the second optical system 130 may include more than two mirrors. For example, in the EUV exposure apparatus 100 of the present embodiment, the second optical system 130 may include four to eight mirrors. However, the number of mirrors of the second optical system 130 is not limited to four to eight.

As described above, the second optical system 130 may be configured to reflect the EUV light L1, which is reflected from the EUV mask M, through the mirrors to be transmitted to the EUV exposure object W. In addition, the second optical system 130 may allow the EUV light L1 to be incident on an upper surface of the EUV exposure object W at a certain angle. For example, the second optical system 130 may allow the EUV light L1 to be incident on the upper surface of the EUV exposure object W at an incidence angle of about 6°.

The control unit 160 may be configured to control the mask stage 140 and the wafer stage 150. The control unit 160 will be described in more detail with reference to FIG. 2 below.

The measuring apparatus 180 may be configured to measure critical dimensions (CDs) or overlay errors of patterns on the wafer. The measuring apparatus 180 may include an optical microscope and/or an electron microscope such as a scanning electron microscope (SEM) or a transmission electron microscope (TEM). The measuring apparatus 180 may configured to use an elliptical polarization method, such as an imaging ellipsometry (IE) or a spectroscopic imaging ellipsometry (SIE), as a measurement method. However, the measurement method used by the measuring apparatus 180 is not limited to the elliptical polarization method.

In the present embodiment, the EUV exposure apparatus 100 includes the measuring apparatus 180, but in another embodiment, the measuring apparatus 180 may be embodied separately from the EUV exposure apparatus 100. CDs or overlay errors of patterns on a wafer may be measured by the measuring apparatus 180 through after-development inspection (ADI) and/or after-cleaning inspection (ACI).

The control unit 160 will now be described in more detail with reference to FIG. 2. The control unit 160 may include a mask stage controller 162, a wafer stage controller 164, a main controller 166, and a data acquisition unit 168.

The mask stage controller 162 may be configured to control the movement of the mask stage 140. Here, the movement of the mask stage 140 may include movement in the x-axis direction, the y-axis direction, and/or the z-axis direction, and/or rotation about the x-axis, the y-axis, and/or the z-axis.

The wafer stage controller 164 may be configured to control the movement of the wafer stage 150. The movement of the wafer stage 150 may also include movement in the x-axis direction, the y-axis direction, and/or the z-axis direction, and/or rotation about the x-axis, the y-axis, and/or the z-axis.

The main controller 166 may include an alignment controller 166a and a feedback unit 166b. The alignment controller 116a may be configured to calculate correction values of parameters of overlay errors. The correction values of the parameters of the overlay errors may be calculated based on data about the parameters of overlay errors, and the correlation between the parameters of overlay errors. Here, the parameters of overlay errors may refer to parameters related to overlay errors between layers on the EUV exposure object W. A parameter of an overlay error will be hereinafter referred to simply as an 'overlay parameter'.

For reference, the overlay error may refer to the difference in overlap between an under-layer and a current layer which is an upper layer. Generally, an overlay error is minimized by performing a shot to align with an under-layer as much as possible when an exposure process is performed on an upper layer, based on an overlay mark or the like on the under-layer. When the overlay error is large (e.g. when the difference in relative position between the under-layer and the current layer is large) the performance of a semiconductor device may be adversely affected by the overlay error.

In the EUV exposure apparatus 100 of the present embodiment, for example, the alignment controller 116a may calculate a correction value of a second overlay parameter from data of a first overlay parameter, based on the correlation between the first overlay parameter and the second overlay parameter. Here, the first overlay parameter may be a parameter RK13 and the second overlay parameter may be a parameter RK12 among overlay parameters. Parameters of overlay errors between layers on a wafer, e.g., overlay parameters, will be described in more detail with reference to FIGS. 3A to 6B below.

The feedback unit 166b may be configured to feed the calculated correction values of the overlay parameters back to the mask stage controller 162 and/or the wafer stage controller 164. The mask stage controller 162 and/or the wafer stage controller 164 may be configured to control the movement of the mask stage 140 and/or wafer stage 150 based on correction values of overlay parameters. For example, the feedback unit 166b may feed the calculated correction value of the second overlay parameter (the parameter RK12) back to the mask stage controller 162, and the mask stage controller 162 may control rotation of the mask stage 140 about the x-axis, based on the correction value of the second overlay parameter.

The main controller 166 may be configured to control the mask stage controller 162 and the wafer stage controller 164 as a whole. For example, the main controller 166 may be configured to control the mask stage controller 162 and the wafer stage controller 164 to be synchronized with each other in a scan direction during an exposure process.

Although not shown in FIG. 2, the main controller 166 may further include various components for control of the EUV exposure process. For example, the main controller 166 may include a focus controller, a data storage, an exposure processor, and/or the like.

The focus controller may be configured to compare a measured focus offset with a required focus offset to obtain a focus correction value and to transmit the focus correction value to the wafer stage controller 164 through the feedback unit 166b so that the wafer stage controller 164 may control the movement of the wafer stage 150. The data storage may store data such as correction values of overlay parameters, the correlation between the overlay parameters, focus correction values, and the like, which are calculated by the alignment controller 116a and/or the focus controller. The exposure processor may be configured to, after the movement of the mask stage 140, perform the exposure process while synchronizing the mask stage 140 and the wafer stage with each other in the scan direction through the main controller 166.

When the measuring apparatus 180 is included in the EUV exposure apparatus 100, the main controller 166 may further include a measurement controller. The measurement controller may be configured to control and/or direct the measuring apparatus 180 to measure data related to required overlay parameters.

The data acquisition unit 168 may be configured to receive data about the overlay parameters through the measuring apparatus 180 and to transmit the data to the main controller 166. For example, an overlay error in the patterns on the wafer may be measured by the measuring apparatus 180, and the data acquisition unit 168 may receive data about the overlay error from the measuring apparatus 180. Therefore, the data acquisition unit 168 may obtain data about the required overlay parameters from the measuring apparatus 180 and transmit the data to the main controller 166. In the EUV exposure apparatus 100 of the present embodiment, the data acquisition unit 168 may obtain, for example, data about the first overlay parameter (e.g., the parameter RK13) through the measuring apparatus 180 and transmit the data to the alignment controller 166a of the main controller 166. However, the data about the overlay parameters obtained by the data acquisition unit 168 is not limited to the data about the parameter RK13.

The control unit 160 and/or the controllers and units included in the control unit 160 (e.g., the mask stage controller 162, the main controller 166, the data acquisition unit 168, wafer stage controller 164 focus controller, and/or exposure processor) may include processing circuitry such hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), memory coupled to a processor, etc.

The EUV exposure apparatus 100 of the present embodiment is capable of adjusting the second overlay parameter to correct the first overlay parameter correlated to the second overlay parameter, thereby greatly improving the EUV process by minimizing and/or preventing an overlay error in the EUV exposure process. Here, the first overlay parameter may correspond to a parameter K13 and the second overlay parameter may correspond to a parameter K12. The parameter K13 may be an overlay parameter that cannot be corrected through physical actuation of the EUV exposure apparatus 100. The physical actuation may refer to physical operation of a scanner (e.g., an exposure apparatus) for correction of an overlay error. For example, the physical operation may include various methods (e.g., a method of applying pressure and/or a tilt to a lens or mirror in an optical system or quickly moving the lens or mirror; a method of moving a mask through the mask stage 140 or moving the EUV exposure object W through the wafer stage 150; a method of heating the EUV exposure object W; and the like). Herein, when overlay parameters are related to physical actuation of a reticle (e.g., a mask) an indicator 'R' may be added to symbols of parameters. For example, when the parameter K12 and the parameter K13 are related to physical actuation of a mask, the parameter K12 and the parameter K13 may be respectively referred to as a parameter RK12 and a parameter RK13.

The EUV exposure apparatus 100 may be configured to determine that an overlay error has occurred in the manufacturing of a semiconductor device for use in an electronic device and to determine the overlay parameter of the overlay error. In the case wherein the overlay parameter (e.g., a first overlay parameter) cannot be directly corrected through physical attenuation, the control unit 160 may adjust a second overlay parameter to correct the first overlay parameter. The semiconductor device with the detected overlay error may still be incorporated into the electronic device, in the case wherein the overlay error is still within the permissible tolerance for errors, and thereafter fabricate subsequent semiconductor devices based on the adjustment; and/or the EUV exposure apparatus 100 may indicate that the semiconductor device is defective, and thereafter fabricate subsequent semiconductor devices based on the adjustment.

For reference, overlay parameters may be classified in various ways, and in particular, some of the overlay parameters cannot be corrected due to hardware limitations of a EUV scanner or a EUV exposure apparatus. For example, the parameter RK13 among the overlay parameters refers to cubic function type overlay distortion in the x-axis direction perpendicular to the scan direction. The parameter RK13 is correctable through physical actuation in an existing argon-fluoride-immersion (ArFi) scanner. However, the parameter RK13 cannot be directly corrected through physical actuation due to control limitations in a EUV scanner having hardware configuration different from that of the ArFi scanner. Accordingly, the parameter RK13 among overlay parameters is classified as a parameter that cannot be corrected in the EUV exposure process. Types of overlay parameters will be described in more detail with reference to FIGS. 4A to 4C below.

Figure 3A:
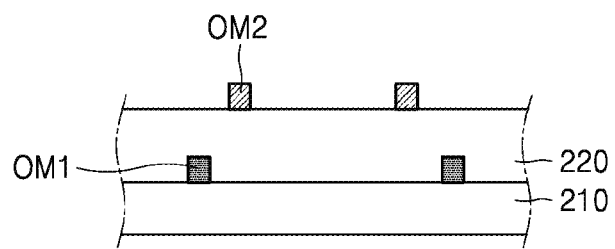
FIGS. 3A and 3B are cross-sectional views for explaining an overlay error.
Figure 3B:
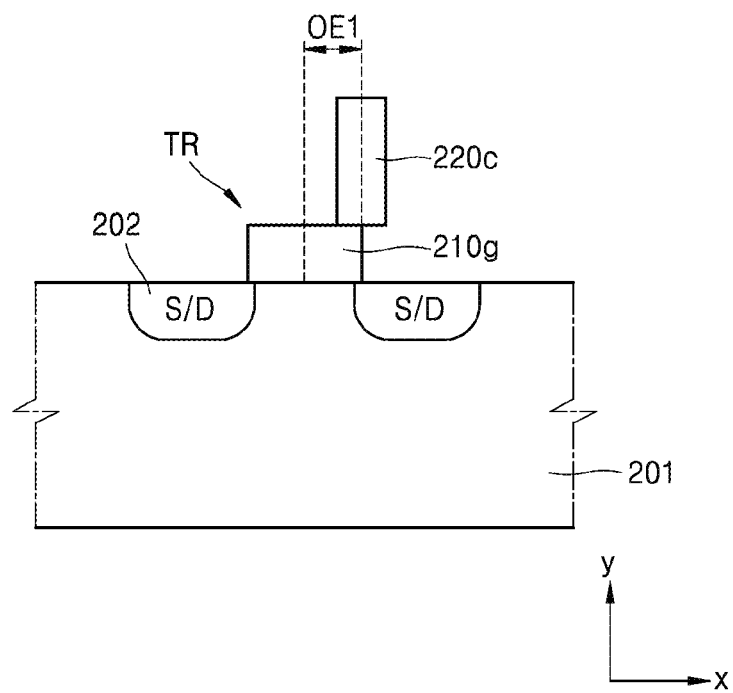

FIGS. 3A and 3B are cross-sectional views for explaining an overlay error.

Referring to FIGS. 3A and 3B, an overlay error may be measured by measuring a first overlay mark OM1 on a first layer 210, which is an under layer, and a second overlay mark OM2 on a second layer 220, which is an upper layer, and calculating the difference in relative position between the first and second overlay marks OM1 and OM2. The first overlay mark OM1 may be formed when a pattern is formed on the first layer 210, and the second overlay mark OM2 may be subsequently formed when a pattern is formed on the second layer 220. The first and second overlay marks OM1 and OM2 may be formed on a scribe lane of a wafer and in a box pattern form and/or a bar pattern form. However, shapes or positions of the first and second overlay marks OM1 and OM2 are not limited thereto.

FIG. 3B illustrates a semiconductor device on a semiconductor substrate 201. Specifically, a transistor TR including a source/drain region 202 and a gate electrode 210g. The transistor may be formed on the semiconductor substrate 201, and a vertical contact 220c connected to the gate electrode 210g may be formed. The gate electrode 210g may correspond to a pattern formed on the first layer 210, which is an under-layer, and the vertical contact 220c may correspond to a pattern formed on the second layer 220, which is an upper layer. When there is no overlay error, the vertical contact 220c may be on a center portion of the gate electrode 210g in reference to a first direction (e.g., an x-axis direction). However, as illustrated in FIG. 3B, a first overlay error OE1 may occur between the gate electrode 210g and the vertical contact 220c in the first direction (the x-axis direction) due to various causes. When the first overlay error OE1 is large, the vertical contact 220c may be unstably connected an edge portion of the gate electrode 210g, connected to the source/drain region 202 beyond the gate electrode 210g, and/or connected to both the gate electrode 210g and the source/drain region 202 while overlapping a part of the gate electrode 201a. The structure of the vertical contact 220c having the first overlay error OE1 may cause a serious error such as an open failure and/or a short failure of the transistor TR.

Figure 4A:
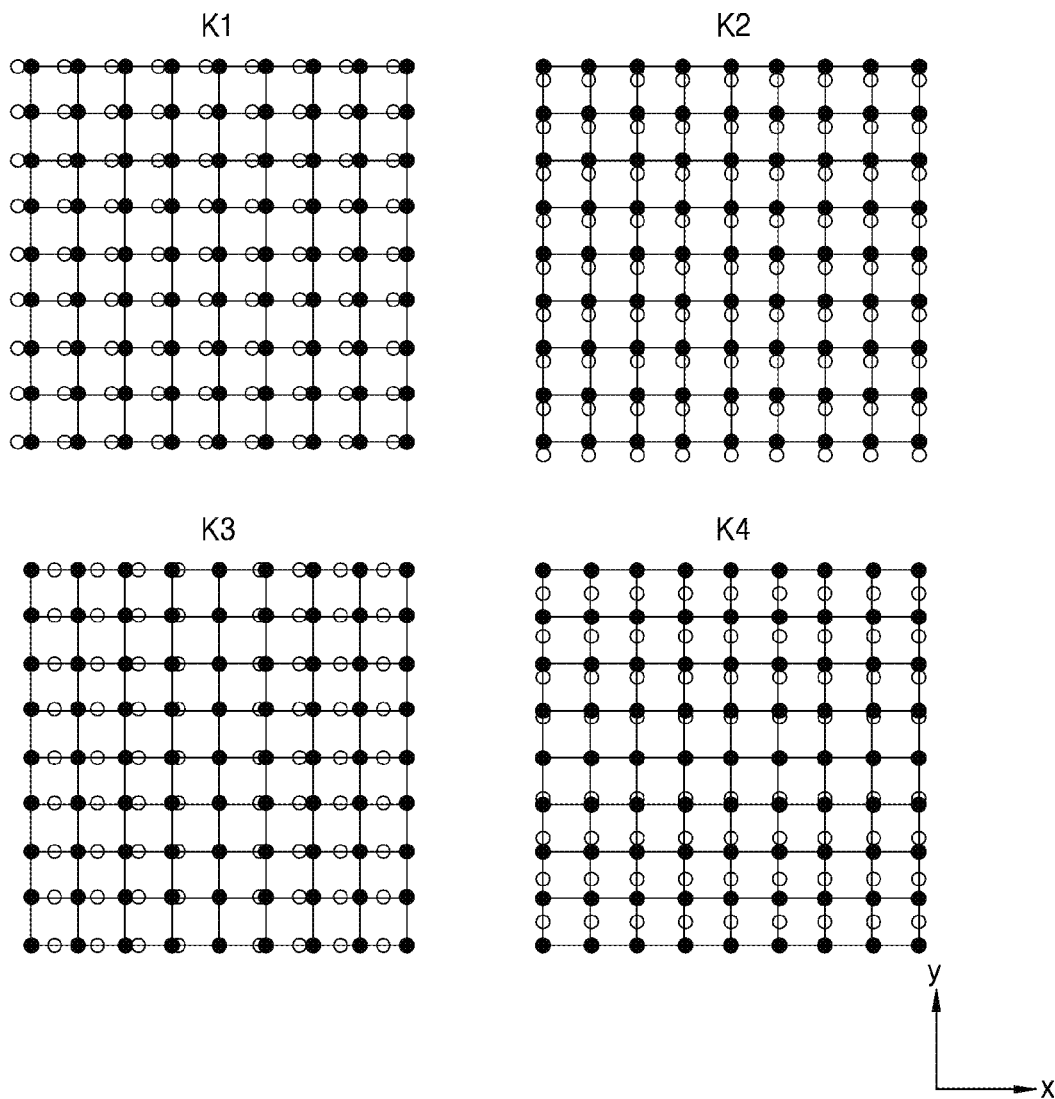
FIGS. 4A to 4C are conceptual diagrams for explaining parameters of overlay errors.
Figure 4B:
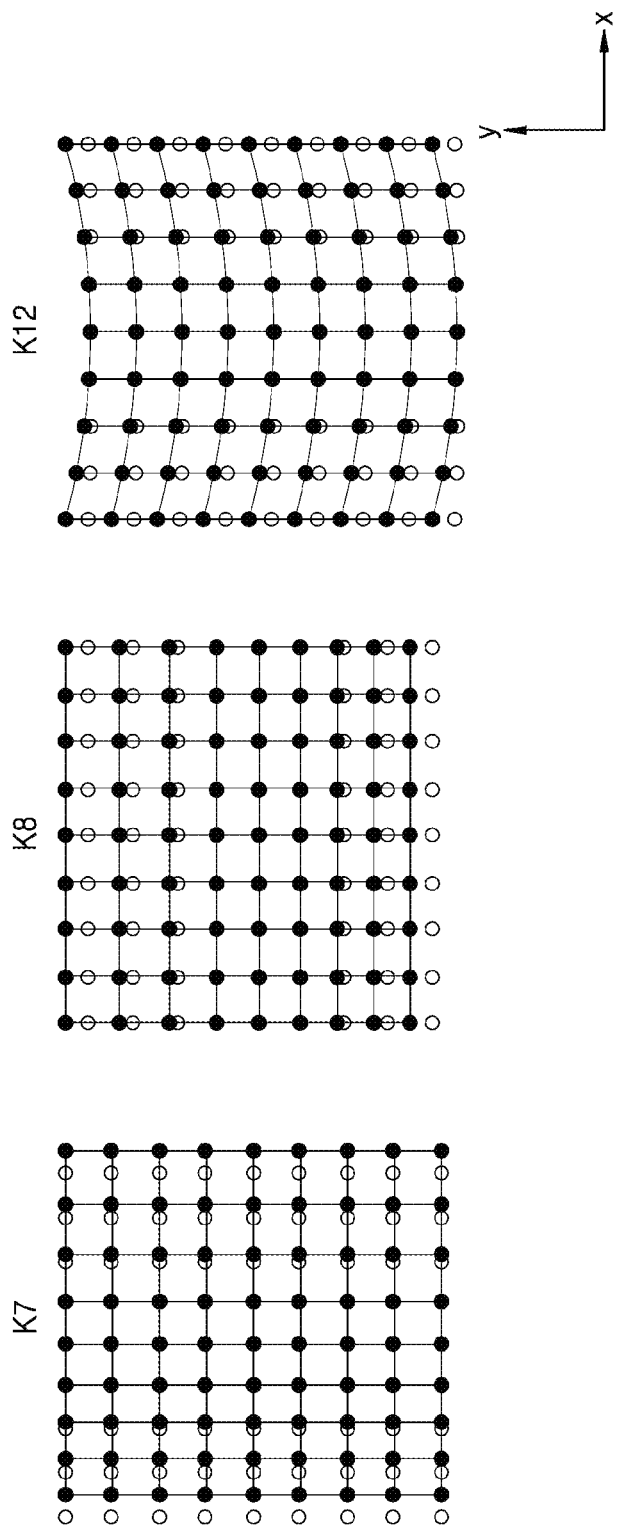
Figure 4C:
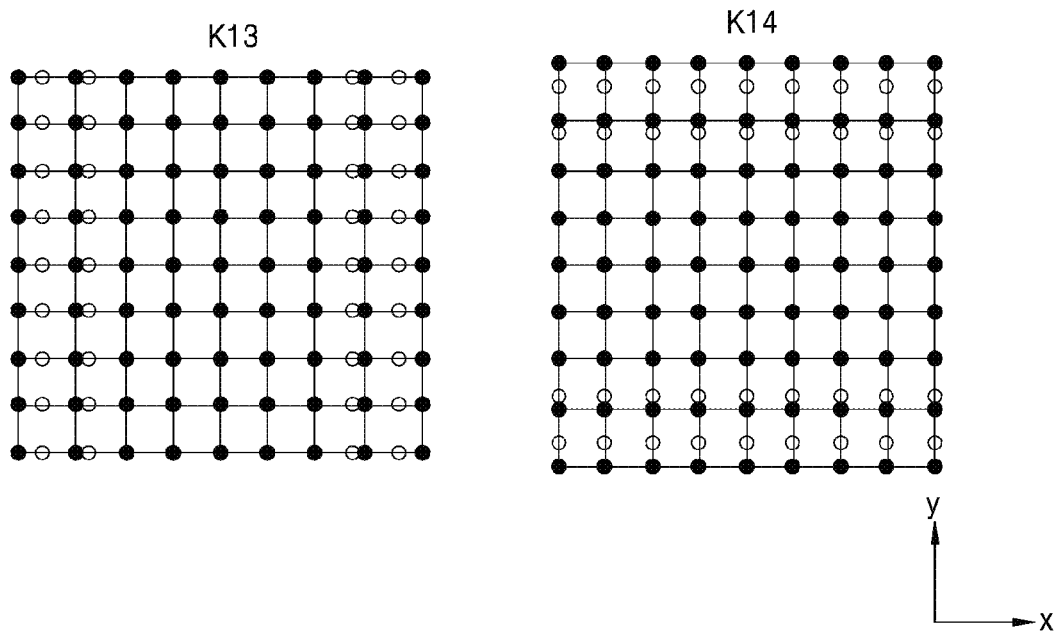

FIGS. 4A to 4C are conceptual diagrams for explaining parameters of overlay errors, e.g., overlay parameters.

FIG. 4A illustrates linear parameters, which are first-order parameters among overlay parameters. For example, a parameter K1 may be a parameter related to an overlay error occurring with a constant magnitude at a side in a first direction (e.g., an x-axis direction), and a parameter K2 may be a parameter related to an overlay error occurring with a constant magnitude at a side in a second direction (e.g., a y-axis direction). When the overlay error occurring in the first direction (e.g., the x-axis direction) is dx and the overlay error occurring in the second direction (e.g., the y-axis direction) is dy, the parameters K1 may be expressed as $dx=k1$ and the parameters K2 may be expressed as $dy=k2$. Here, the second direction (e.g., the y-axis direction) corresponds to a scan direction in a EUV exposure process, and the first direction (e.g., the x-axis direction) may be a direction perpendicular to the second direction (e.g., the y-axis direction). The first direction (e.g., the x-axis direction) may correspond to a direction in which a curved slit form of EUV light extends.

A parameter K3 may be a parameter related to an overlay error occurring with a magnitude proportional to a position and at both sides in the first direction (e.g., the x-axis direction), and which includes mirror-like symmetry across the y-axis at the position. A parameter K4 may be a parameter related to an overlay error occurring with a magnitude proportional to a position and at both sides in the second direction (e.g., the y-axis direction) which includes mirror-like symmetry across the x-axis at the position. Accordingly, the parameter K3 may be expressed as $dx=k3*x$ and the parameter K4 may be expressed as $dy=k4*y$.

The linear parameters may include a parameter K5 expressed as $dx=k5*y$ and a parameter K6 expressed as $dy=k6*x$, as well as the parameters K1 to K4.

FIG. 4B illustrates parameters which are second-order parameters among overlay parameters. For example, a parameter K7 may be a parameter related to an overlay error occurring with a magnitude proportional to the square of a position and at both sides in the first direction (e.g., the x-axis direction). A parameter K8 may be a parameter related to an overlay error occurring with a magnitude proportional to the square of a position and at both sides in the second direction (e.g., the y-axis direction), right parameter K12 may be a parameter related to an overlay error occurring with a magnitude proportional to the square of positions at both sides in the first direction (e.g., the x-axis direction) and occurring in the second direction (e.g., the y-axis direction). Accordingly, the parameter K7 may be expressed as $dx=k7*x^2$, the parameter K8 may be expressed as $dy=k8*y^2$, and the parameter K12 may be expressed as $dy=k12*x^2$.

The second-order parameters may include a parameter K9 expressed as $dx=k9*x*y$, a parameter K10 expressed as $dy=k10*y*x$, and a parameter K11 expressed as $dx=k11*y^2$, as well as the parameters K7, K8, and K12.

FIG. 4C illustrates parameters which are third-order parameters among overlay parameters. For example, a parameter K13 may be a parameter related to an overlay error occurring with a magnitude proportional to the cube of a position and at both sides in the first direction (e.g., the x-axis direction), and a parameter K14 may be a parameter related to an overlay error occurring with a magnitude proportional to the cube of a position and at both sides in the second direction (e.g., the y-axis direction). Accordingly, the parameter K13 may be expressed as $dx=k13*x^3$ and the parameter K14 may be expressed as $dy=k14*y^3$.

The third-order parameters may include a parameter K15 expressed as $dx=k15*x^2*y$, a parameter K16 expressed as $dy=k16*y^2*x$, a parameter K17 expressed as $dx=k17*x*y^2$, a parameter K18 expressed as $dy=k18*y*x^2$, a parameter K19 expressed as $dx=k19*y^3$, and a parameter K20 expressed as $dy=k20*x^3$, as well as the parameters K13 and K14.

As described above, in an ArFi exposure apparatus, all overlay parameters are correctable through physical actuation. In a EUV exposure apparatus, most of overlay parameters are correctable through physical actuation similar to the ArFi exposure apparatus. However, in the EUV exposure apparatus, it is almost impossible to directly correct the K13 parameter through physical actuation.

Figure 5A:
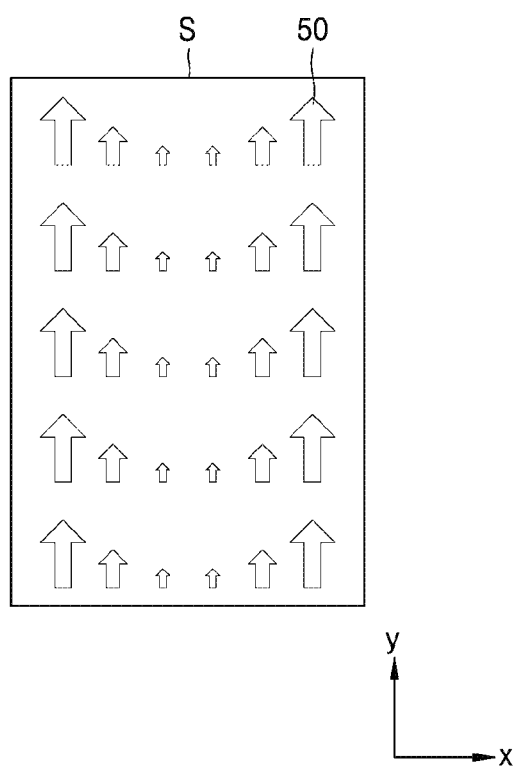
FIGS. 5A and 5B are a vector diagram and a graph for explaining a parameter RK12 of an overlay error.
Figure 5B:
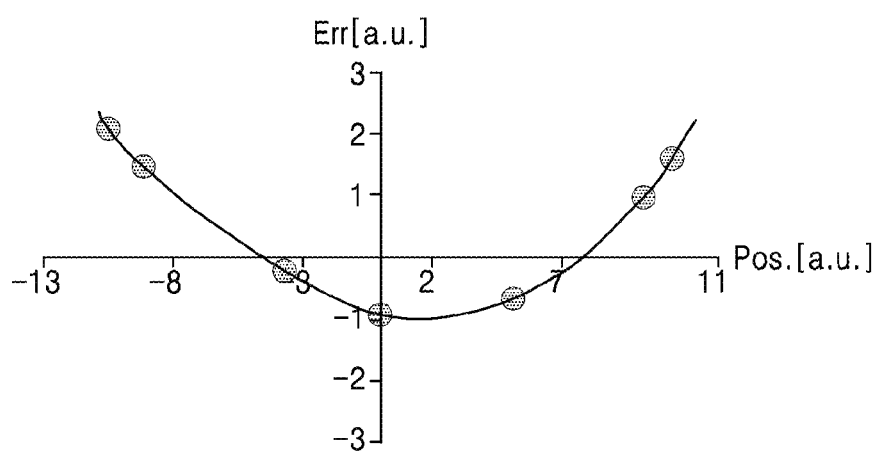

FIGS. 5A and 5B are a vector diagram and a graph for explaining a parameter RK12 of an overlay error. In the graph of FIG. 5B, the horizontal-axis represents a position Pos., the vertical-axis represents an overlay error Err, and units on the horizontal-axis and the vertical-axis are arbitrary units (a.u.) representing relative magnitudes.

Referring to FIGS. 5A and 5B, a size and direction of a vector 50 of FIG. 5A may represent a magnitude and direction of an overlay error. Accordingly, it can be seen that as a distance from the center in a first direction (e.g., an x-axis direction) increases, a magnitude of an overlay error related to the parameter RK12 increases in a second direction (e.g., a y-axis direction). A magnitude of the overlay error related to the parameter RK12 may two-dimensionally increase in the second direction (e.g., the y-axis direction) with respect to a position in the first direction (e.g., the x-axis direction). That is, the magnitude of the overlay error related to the parameter RK12 in the second direction (e.g., the y-axis direction) may increase in proportion to the square of the position in the first direction (e.g., the x-axis direction).

FIG. 5B is a graph showing that the magnitude of the overlay error related to the parameter RK12 two-dimensionally increases with respect to the position. For reference, a rectangle S of FIG. 5A may be in a form corresponding to one shot in an exposure process. Accordingly, a magnitude of the overlay error in the second direction (e.g., the y-axis direction) is maximum at portions corresponding to both sides of one shot, and an overlay error having the substantially same form as the overlay error may repeatedly occur in adjacent subsequent shots.

Figure 6A:
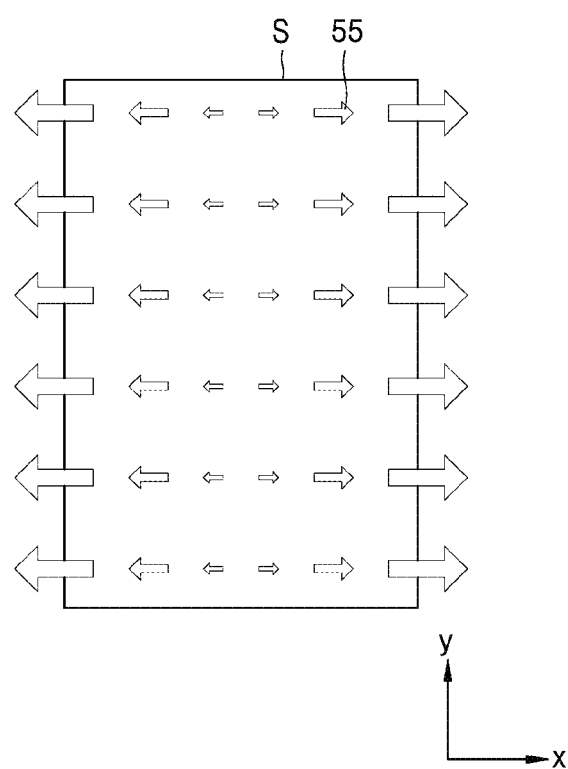
FIGS. 6A and 6B are a vector diagram and a graph for explaining a parameter RK13 of an overlay error.
Figure 6B:
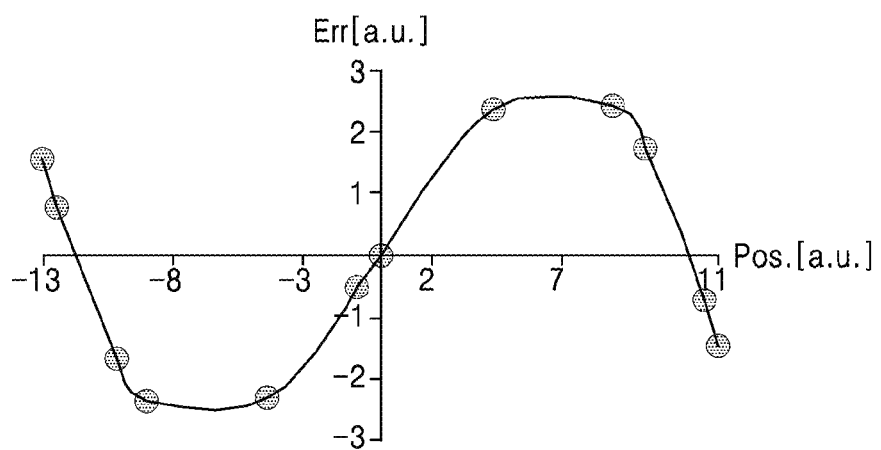

FIGS. 6A and 6B are a vector diagram and a graph for explaining the RK13 parameter of an overlay error. In the graph of FIG. 6B, the horizontal-axis represents a position Pos., the vertical-axis represents an overlay error Err, and units on the x-axis and the y-axis are arbitrary units representing relative magnitudes.

Referring to FIGS. 6A and 6B, a size and direction of a vector 55 of FIG. 6A may represent a magnitude and direction of the overlay error. Accordingly, it can be seen that as a distance from a center increases in a first direction (e.g., an x-axis direction), a magnitude of the overlay error related to the parameter RK13 increases. The magnitude of the overlay error related to the parameter RK13 may three-dimensionally increase in the first direction (e.g., the x-axis direction) with respect to a position in the first direction (e.g., the x-axis direction). That is, the magnitude of the overlay error related to the parameter RK13 in the first direction (e.g., the x-axis direction) may increase in proportion to the cube of the position in the first direction (e.g., the x-axis direction).

FIG. 6B is a graph showing that the magnitude of the overlay error related to the parameter RK13 three-dimensionally increases with respect to the position. As described above with reference to FIGS. 5A and 5B, a rectangle S of FIG. 6A may be in a form corresponding to one shot in an exposure process, and the magnitude of the overlay error may be maximum at portions corresponding to both sides of the shot. In addition, the overlay may repeatedly occur in substantially the same form in adjacent subsequent shots.

FIGS. 7A to 7D are graphs for explaining correcting the parameter RK13 of an overlay error in a EUV exposure apparatus according to an example embodiment of the inventive concepts. FIGS. 7A to 7D will be described with reference to FIGS. 1 and 2.

Figure 7A:
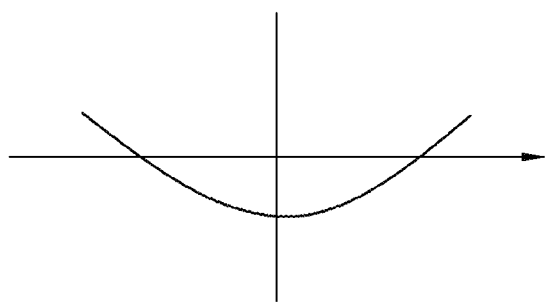
FIGS. 7A to 7D are graphs for explaining correcting the parameter RK13 of an overlay error by an EUV exposure apparatus according to an example embodiment of the inventive concepts.
Figure 7A:
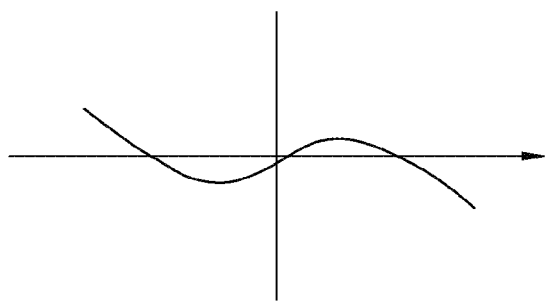
Figure 7B:
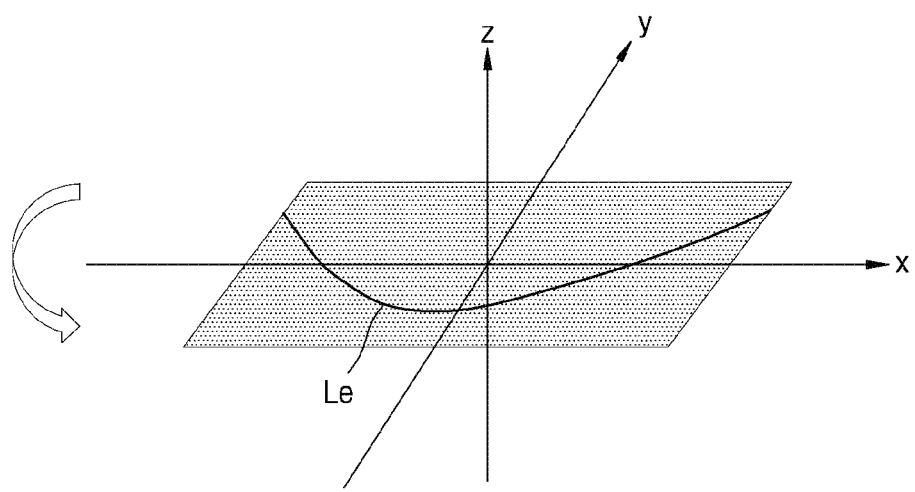

Referring to FIGS. 7A to 7D, FIG. 7A is a result of simplifying the graphs of FIGS. 5B and 6B, in which overlay errors related to the parameters RK12 and RK13 are shown. FIG. 7B shows EUV light which is in a curved slit form in a three-dimensional (3D) x-y-z space. Here, a second direction (e.g., a y-axis direction) is a scan direction in a EUV exposure process and a first direction (e.g., an x-axis direction) is a direction perpendicular to the second direction (e.g., the y-axis direction). A third direction (e.g., a z-axis direction) corresponds to a direction normal to an upper surface of the EUV exposure object W and may be a direction perpendicular to an x-y plane.

The x-y plane may correspond to a lower surface of the EUV mask M on which an absorption layer pattern is formed. Accordingly, EUV light from the EUV light source 110 may be incident in a curved slit form on the lower surface of the EUV mask M via the first optical system 120, e.g., a hatched portion on the x-y plane of FIG. 7B. Accordingly, a curved slit drawn on the hatched portion may correspond to EUV light Le.

In general, in order to correct the overlay error related to the parameter RK12 (hereinafter referred to simply as 'parameter RK12 correction'), a method of rotating the EUV mask M about an x-axis as indicated by a curved arrow may be used. More specifically, the overlay error related to the parameter RK12 may be corrected by rotating the EUV mask M by rotating the mask stage 140 on which the EUV mask M is placed through the mask stage controller 162.

Figure 7C:
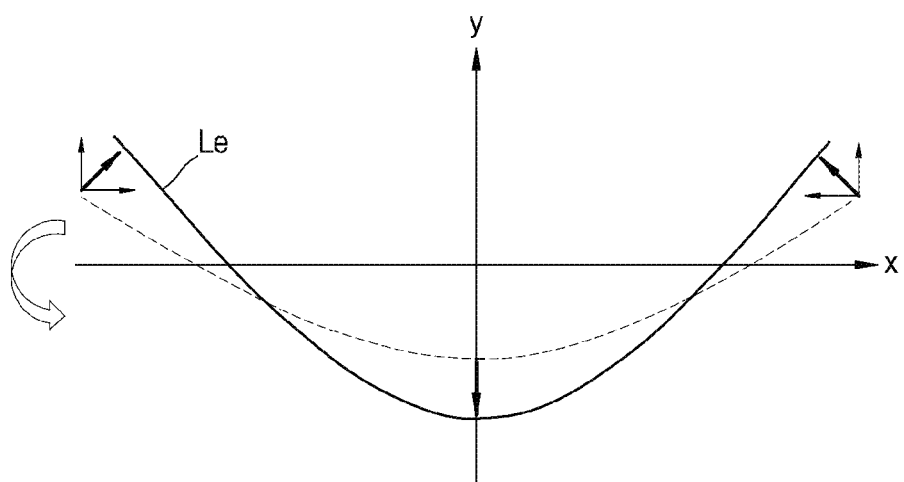

However, due to non-telecentric characteristics of the EUV exposure apparatus 100 and the EUV light, which is incident in the curved slit form on the EUV mask M, not only a component of the EUV light in the second direction (e.g., the y-axis direction) but also a component thereof in the first direction (e.g., the x-axis direction) changes when a change of a component of the EUV light in the third direction (e.g., the z-axis direction) occurs during rotation about the x-axis. FIG. 7C is a graph showing this process, in which when the EUV mask M is rotated about the x-axis, the components of the EUV light, which is in the curved slit form, in the first direction (e.g., the x-axis direction) and the second direction (e.g., the y-axis direction) simultaneously change. In FIG. 7C, through the rotation of the EUV mask M about the x-axis, the EUV light, which is in the curved slit form, may be changed such that a center portion is lowered and both outer portions are raised in the y-axis direction, and vice versa. For example, through the rotation of the EUV mask M about the x-axis, the EUV light, which is in the curved slit form, may be changed such that the center portion is raised and both the outer portions are lowered in the y-axis direction.

Therefore, in order to correct the parameter RK12, when the EUV mask M is rotated about on the x-axis, overlay parameters, which are parasitic parameters related to the first direction (e.g., the x-direction), may be corrected. For example, the parameter RK3, or the parameter RK13 or the like, which is a parasitic parameter, may be corrected due to the correction of the parameter RK12.

When the relation between the overlay parameters influenced with each other is referred to as a correlation, the correlation between the parameters RK12 and RK13 may be expressed as 1:K, which is a ratio between a correction value of the parameter RK12 to be corrected through rotation of the EUV mask M about the x-axis and a correction value of the parameter RK13, which is a parasitic parameter to be corrected due to the correction of the parameter RK12, wherein K may be in a range of −0.25 to −0.45.

Figure 7D:
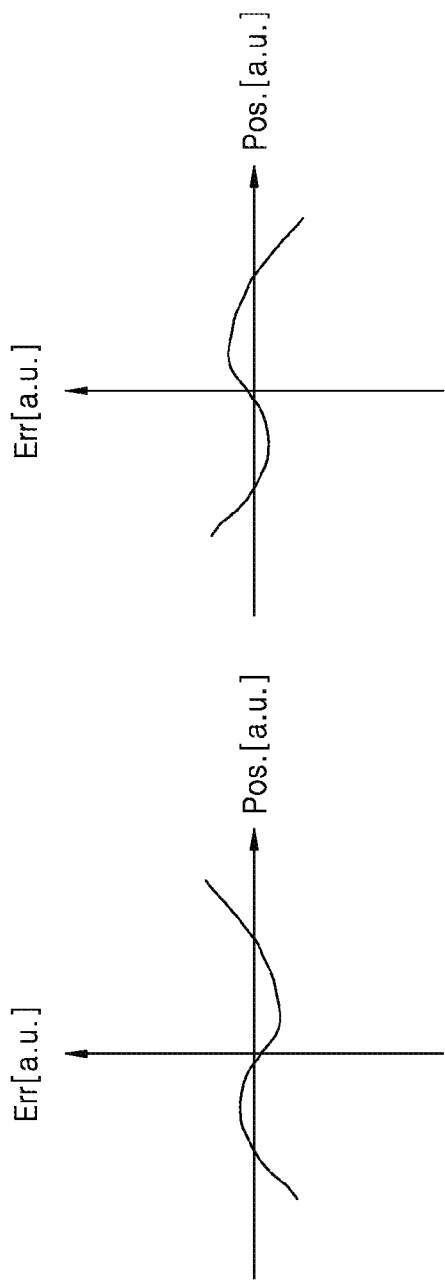

The correction value of the parameter RK13 may have a (+) sign when an absolute value of an error Err increases in first and third quadrants according to a position Pos. on the x-axis direction as shown in the left graph of FIG. 7D, and have a (−) sign when the absolute value of the error Err increases in second and fourth quadrants according to the position Pos. on the x-axis direction as shown in the right graph of FIG. 7D. Although not shown, the correction value of the parameter RK12 may have a (+) sign in the case of a structure bulging downward and have a (−) sign in the case of a structure bulging upward.

As an example, as shown in Table 1 below, when the parameter RK12 is corrected by about 1 as an input through rotation of the EUV mask M about the x-axis, the parameter RK12 may be corrected by about 1.02 as a first output Output1. As described above, set-get accuracy, which is the difference between an input and an output, cannot be 100% due to a physical limitation of an actuator for movement of a stage in a EUV exposure apparatus.

TABLE 1

| Input | Output1 | Output2 | Output3 |
|---|---|---|---|
| 1*KR12 | RK12:1.02*RK12 | RK3:0.21*RK12 | RK13:−0.35.02*RK12 |

It can be seen that the parameter RK3 is corrected by about 0.21 as a second output Output2 and the parameter RK13 is corrected by about −0.35 as a third output Output3. As described above, the parameters RK3 and RK13 are parasitic parameters generated during correction of the parameter RK12.

For reference, when the correlation between the parameters RK12 and RK13 is explained with more specific values through rotation of the EUV mask M about the x-axis, an overlay error of about −1 nm per cm² may be corrected with respect to the parameter RK13 when an overlay error of about 3 nm per cm$^2$ is corrected through rotation of the EUV mask M about the x-axis with respect to the parameter RK12.

The EUV exposure apparatus 100 of the present embodiment is capable of correcting the parameter RK13, which is a parasitic parameter, by correcting the parameter RK12 according to the correlation between the parameters RK12 and RK13. Accordingly, the EUV exposure apparatus 100 of the present embodiment is capable of substantially correcting the parameter RK13, which was classified as an overlay parameter that cannot be directly corrected. In addition, the parameter RK13 is related to an overlay error in the x-axis direction and a process margin of the overlay error is very small. Therefore, it is impossible to directly control and correct the RK13 parameter through the current EUV exposure apparatus 100. In contrast, the parameter RK12 is related to an overlay error in the y-axis direction and a process margin of the overlay error is large. Therefore, it is easy to directly control and correct the parameter RK12 and the parameter RK13 may be indirectly corrected through correction of the parameter RK12 within the process margin.

The correction of the parameter RK12 and indirect correction of the parameter RK13, which is a parasitic parameter, may be performed by performing a feedback process several times. For example, correction of the parameter RK12 may be performed several times for optimal correction of the parameter RK13.

Figure 8A:
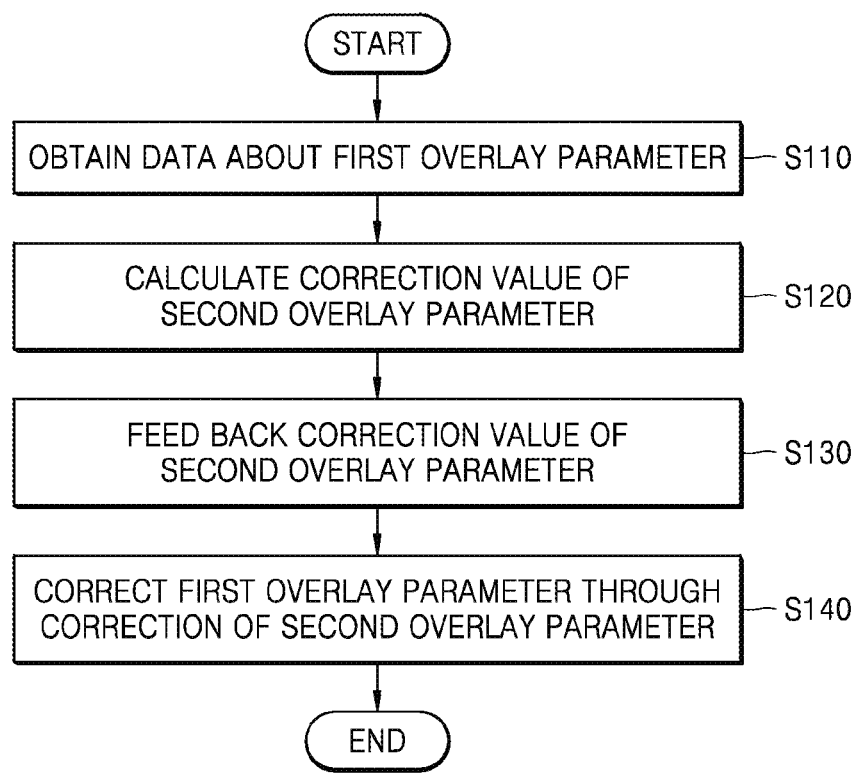
FIGS. 8A and 8B are flowcharts schematically illustrating overlay correction methods using an EUV exposure apparatus, according to some example embodiments of the inventive concepts.
Figure 8B:
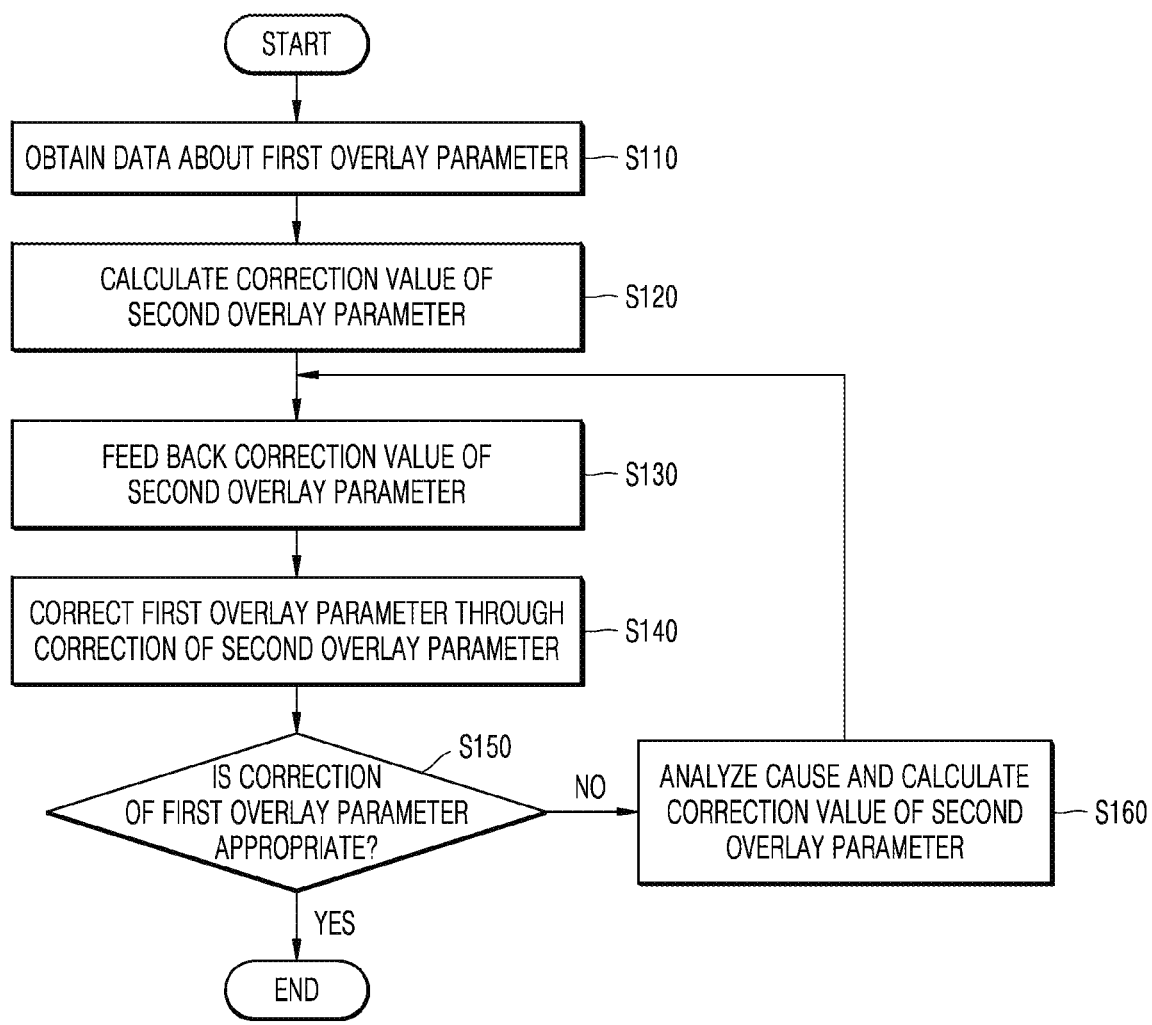

FIGS. 8A and 8B are flowcharts schematically illustrating overlay correction methods using a EUV exposure apparatus, according to example embodiments of the inventive concepts. FIGS. 8A and 8B will be described with reference to FIGS. 1 and 2.

Referring to FIG. 8A, in an overlay correction method using an exposure apparatus of the present example embodiment (hereinafter referred to simply as an 'overlay correction method'), first, data about a first overlay parameter is obtained (S110). The first overlay parameter may be, for example, the parameter RK13 classified as a parameter which cannot be directly directed by a EUV exposure apparatus. Therefore, the data about the first overlay parameter may be understood as data related to an overlay error related to the parameter RK13 and occurring in the EUV exposure object Won which a EUV exposure process is performed. The data about the first overlay parameter may be obtained by the data acquisition unit 168 through the measuring apparatus 180. The data about the first overlay parameter may be obtained as ADI or ACI data through the measuring apparatus 180.

Next, a correction value of a second overlay parameter is calculated, based on the correlation between the first overlay parameter and the second overlay parameter (S120). The correction value of the second overlay parameter may be calculated by the alignment controller 166a as described above. The correlation between the first overlay parameter and the second overlay parameter may refer to a ratio between the correction value of the second overlay parameter and the correction value of the first overlay parameter. In the overlay correction method of the present embodiment, the correlation may be expressed as 1:K and K may be in a range of about −0.25 to −0.45.

For example, when K is −0.35 and the correction value of the first overlay parameter is 1 based on the data about the first overlay parameter obtained by the data acquisition unit 168, the correction value of the second overlay parameter may be calculated as the first overlay parameter (1) divided by K(−0.35). In the present example, the correction value of the second overlay parameter would equal −2.86, based on the correlation.

Next, for the EUV exposure process performed on a subsequent lot (e.g., a subsequent wafer and/or group of wafers), the correction value of the calculated second overlay parameter is fed back (S130). Here, the lot refers to a process quantity unit of an exposure object W on which the exposure process is performed under the same process conditions after process conditions for the exposure process are controlled. For example, the correction value of the second overlay parameter calculated by the alignment controller 166a may be transmitted to the feedback unit 166b and then fed back to the mask stage controller 162 through the feedback unit 166b.

Lastly, in the EUV exposure process for the subsequent lot, the second overlay parameter is corrected and the first overlay parameter, which is a parasitic parameter, is corrected according to the correction of the second overlay parameter (S140). More specifically, the mask stage controller 162 controls movement of the mask stage 140, based on the correction value of the second overlay parameter. For example, in order to correct the parameter RK12, the mask stage controller 162 controls rotation of the mask stage 140 about the x-axis, based on the correction value of the second overlay parameter. Thereafter, the EUV exposure process is performed on the subsequent lot to correct the second overlay parameter, e.g., the parameter RK12, and the first overlay parameter, which is a parasitic parameter, e.g., the parameter RK13, may be corrected according to the correction of the parameter RK12.

Referring to FIG. 8B, the overlay correction method of the present embodiment is similar to the overlay correction method of FIG. 8A but may be different from the overlay correction method of FIG. 8A in that operations are further performed to repeatedly provide feedback. In detail, in the overlay correction method of the present embodiment, obtaining data about a first overlay parameter (S110), calculating a correction value of a second overlay parameter (S120), feeding back the correction value of the second overlay parameter (S130), and correcting the first overlay parameter through correction of the correction of the second overlay parameter (S140) are sequentially performed. Here, the first overlay parameter may be the parameter RK13, the second overlay parameter may be the parameter RK12, and the above operations are as described above with reference to FIG. 8A.

Next, it is determined whether the correction of the first overlay parameter is appropriate (S150). In other words, it is determined whether a degree of the correction of the first overlay parameter through the correction of the second overlay parameter is within a required range. In the determining of whether the correction of the first overlay parameter is appropriate, the adequacy of the correction of the second overlay parameter may be determined.

When the correction of the first overlay parameter is appropriate (Yes), the overlay correction method of the present embodiment is ended.

When the correction of the first overlay parameter is not appropriate (No), a cause thereof is analyzed and a correction value of the second overlay parameter is calculated again (S160). The correction value of the second overlay parameter may be calculated from a correlation between the first overlay parameter and the second overlay parameter considering the above-described cause. Thereafter, the method returns back to the feeding back of the correction value of the second overlay parameter (S130) and the subsequent operations are repeatedly performed until the first overlay parameter is appropriately corrected.

Figure 9A:
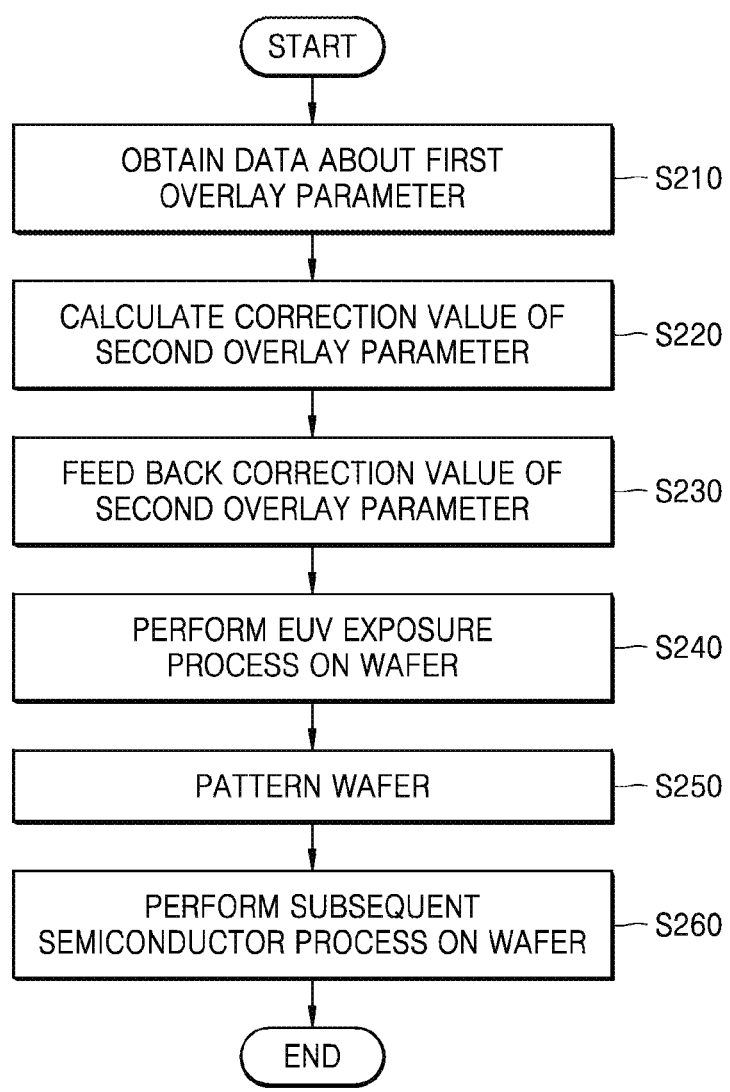

FIGS. 9A and 9B are flowcharts schematically illustrating semiconductor device fabricating methods using a EUV exposure apparatus, according to example embodiments of the inventive concepts. FIGS. 9A and 9B will be described with reference to FIGS. 1 and 2, and the above description with reference to FIGS. 1 and 2 will be briefly provided or omitted herein.

Referring to FIG. 9A, in a semiconductor device fabricating method using an EUV exposure apparatus according to an embodiment of the inventive concepts (hereinafter referred to simply as a "semiconductor device fabricating method"), obtaining data about a first overlay parameter (S210), calculating a correction value of a second overlay parameter (S220), and feeding back the correction value of the second overlay parameter (S230) are sequentially performed. Here, the first overlay parameter may be the parameter RK13, the second overlay parameter may be the parameter RK12, and the above operations are as described above with reference to FIG. 8A.

Next, a EUV exposure process is performed on a wafer (S240). The EUV exposure process performed on the wafer may be a process in which EUV light is incident in a curved slit form on the EUV mask M through the first optical system 120 and EUV light reflected from the EUV mask M is projected to the EUV exposure object W, e.g., the wafer, through the second optical system 130. Here, the EUV light may be projected to a photoresist (PR) on the wafer. The EUV exposure process performed on the wafer may include forming a PR pattern by performing a development process and a cleaning process on the PR.

The performing of the EUV exposure process on the wafer (S240) may be substantially the same as the correcting of the first overlay parameter through the correction of the second overlay parameter, which is described above with reference to FIG. 8A. However, in order to emphasize the relationship with subsequent operations, the expression 'EUV exposure process on the wafer' is used herein. Thus, the performing of the EUV exposure process on the wafer (S240) may include correcting the first overlay parameter through correction of the second overlay parameter.

After the performing of the EUV exposure process on the wafer (S240), the wafer is patterned (S250). The patterning of the wafer may refer to a process of forming a pattern on the wafer through an etching process using the PR pattern as a mask. The pattern on the wafer may be understood to mean that the absorption layer pattern of the EUV mask M is transferred to the wafer through an exposure process and the etching process.

Thereafter, a subsequent semiconductor process is performed on the wafer (S260). The subsequent semiconductor process may include various processes. For example, the subsequent semiconductor process may include a deposition process, an etching process, an ion process, a cleaning process, and the like. The subsequent semiconductor process may further include a singulation process of individualizing the wafer into semiconductor chips, a test process of testing the semiconductor chips, and a packaging process of packaging the semiconductor chips. A semiconductor device may be completed by performing the subsequent semiconductor process on the wafer.

Referring to FIG. 9B, a semiconductor device fabricating method of the present embodiment is similar to the semiconductor device fabricating method of FIG. 9A but may be different from the semiconductor device fabricating method of FIG. 9A in that operations are further performed to repeatedly provide feedback. In detail, in the semiconductor device fabricating method of the present embodiment, obtaining data about a first overlay parameter (S210), calculating a correction value of a second overlay parameter (S220), feeding back the correction value of the second overlay parameter (S230), and performing a EUV exposure process on a wafer (S240) are sequentially performed. Here, the first overlay parameter may be the parameter RK13, the second overlay parameter may be the parameter RK12, and the above operations are as described above with reference to FIG. 9A.

Next, it is determined whether the correction of the first overlay parameter is appropriate (S242). For example, it is determined whether a degree of the correction of the first overlay parameter through the correction of the second overlay parameter is within a required range. In the determining of whether the correction of the first overlay parameter is appropriate, the adequacy of the correction of the second overlay parameter may be determined.

When the correction of the first overlay parameter is appropriate (Yes), patterning the wafer (S250) and performing a subsequent semiconductor process on the wafer (S260) are sequentially performed and thereafter the semiconductor device fabricating method of the present embodiment is ended.

When the correction of the first overlay parameter is not appropriate (No), a cause thereof is analyzed and a correction value of the second overlay parameter is calculated again (S244). The correction value of the second overlay parameter may be calculated from a correlation between the first overlay parameter and the second overlay parameter in considering the above-described cause. Thereafter, the method returns back to the feeding back of the correction value of the second overlay parameter (S130) and the subsequent operations are repeatedly performed until the first overlay parameter is appropriately corrected.

While the inventive concepts have been particularly shown and described with reference to embodiments thereof, it will be understood that various changes in form and details may be made therein without departing from the spirit and scope of the following claims.

What is claimed is:

1. An overlay correction method performed by an extreme ultraviolet (EUV) exposure apparatus, the overlay correction method comprising:

obtaining, by the EUV exposure apparatus, data about a first overlay parameter among parameters of overlay errors between layers on a wafer on which an EUV exposure process is performed, the first overlay parameter being related to an error which three-dimensionally increases on both sides of an axis in a first direction perpendicular to a scan direction in the EUV exposure process;

calculating, by the EUV exposure apparatus, a correction value of a second overlay parameter among the parameters of overlay errors, based on a correlation between the first overlay parameter and the second overlay parameter, the second overlay parameter being related to an error which two-dimensionally increases in the scan direction as a distance from the axis increases in the first direction;

feeding back the correction value of the second overlay parameter in the EUV exposure apparatus; and correcting, by the EUV exposure apparatus, the first overlay parameter by correcting the second overlay parameter, based on the correction value of the second overlay parameter.

2. The overlay correction method of claim 1, wherein
the correlation refers to a ratio between the correction value of the second overlay parameter and a correction value of the first overlay parameter, and
the correlation is 1:K, where K is in a range of −0.25 to −0.45.

3. The overlay correction method of claim 1, wherein the EUV exposure apparatus comprises:
a EUV light source, a mask stage, and a control unit configured to control the mask stage, and
the correcting of the first overlay parameter comprises correcting the second overlay parameter by rotating the mask stage, based on the correction value of the second overlay parameter.

4. The overlay correction method of claim 3, wherein the control unit comprises:
a mask stage controller configured to control the mask stage, a data acquisition unit configured to obtain the data about the first overlay parameter, an alignment controller configured to calculate the correction value of the second overlay parameter, and a feedback unit configured to transmit the correction value of the second overlay parameter to the mask stage controller,
wherein the mask stage controller rotates the mask stage about the first direction as an axis, based on the correction value of the second overlay parameter.

5. The overlay correction method of claim 1, wherein, when a process margin for the second overlay parameter is A, the first overlay parameter is corrected by correcting the second overlay parameter within a range of A.

6. A semiconductor device fabricating method using an extreme ultraviolet (EUV) exposure apparatus, the semiconductor device fabricating method comprising:
obtaining, by the EUV exposure apparatus, data about a first overlay parameter among parameters of overlay errors between layers on a first wafer on which an EUV exposure process is performed, the first overlay parameter being related to an error which three-dimensionally increases on both sides of an axis in a first direction perpendicular to a scan direction in the EUV exposure process;
calculating, by the EUV exposure apparatus, a correction value of a second overlay parameter among the parameters of overlay errors, based on a correlation between the first overlay parameter and the second overlay parameter, the second overlay parameter being related to an error which two-dimensionally increases in the scan direction as a distance from the axis increases in the first direction;
feeding back the correction value of the second overlay parameter in the EUV exposure apparatus;
performing the EUV exposure process on a second wafer by the EUV exposure apparatus;
patterning the second wafer; and
performing a subsequent semiconductor process on the second wafer,
wherein the performing of the EUV exposure process on the second wafer comprises correcting the first overlay parameter by correcting the second overlay parameter, based on the correction value of the second overlay parameter.

7. The semiconductor device fabricating method of claim 6, wherein
the correlation refers to a ratio between the correction value of the second overlay parameter and a correction value of the first overlay parameter, and
the correlation is 1:K, wherein K is in a range of −0.25 to −0.45.

8. The semiconductor device fabricating method of claim 6, wherein
the EUV exposure apparatus comprises an EUV light source, a mask stage on which the EUV mask is placed, and a control unit configured to control the mask stage, and
the performing of the EUV exposure process on the second wafer comprises correcting the second overlay parameter by rotating the mask stage, based on the correction value of the second overlay parameter.

9. The semiconductor device fabricating method of claim 8, wherein
the control unit comprises a mask stage controller configured to control the mask stage, a data acquisition unit configured to obtain the data about the first overlay parameter, an alignment controller configured to calculate the correction value of the second overlay parameter, and a feedback unit configured to transmit the correction value of the second overlay parameter to the mask stage controller, and
wherein the mask stage controller is configured to control the rotation of the mask stage about the first direction as an axis, based on the correction value of the second overlay parameter.

10. The semiconductor device fabricating method of claim 6, further comprising:
after the performing of the EUV exposure process on the second wafer, determining whether the correction of the first overlay parameter is appropriate with respect to the second wafer,
wherein, when the correction of the first overlay parameter is not appropriate with respect to the second wafer, the calculating of the correction value of the second overlay parameter and the performing of the EUV exposure process on the second wafer are repeated.

* * * * *